(12) United States Patent
Cassidy

(10) Patent No.: US 8,365,053 B2
(45) Date of Patent: Jan. 29, 2013

(54) ENCODING AND DECODING DATA USING STORE AND EXCLUSIVE OR OPERATIONS

(75) Inventor: Bruce M. Cassidy, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 863 days.

(21) Appl. No.: 12/473,161

(22) Filed: May 27, 2009

(65) Prior Publication Data

US 2010/0306621 A1    Dec. 2, 2010

(51) Int. Cl.
*H03M 13/00* (2006.01)
(52) U.S. Cl. ........................................ 714/784; 714/799
(58) Field of Classification Search .................. 714/784, 714/799
See application file for complete search history.

(56) References Cited

U.S. PATENT DOCUMENTS

| | | | |
|---|---|---|---|
| 5,375,127 A | 12/1994 | Leak et al. | |
| 5,754,563 A | 5/1998 | White et al. | |
| 5,948,117 A * | 9/1999 | Weng et al. | 714/784 |
| 6,347,389 B1 | 2/2002 | Boyer | |
| 6,452,985 B1 * | 9/2002 | Hatakeyama et al. | 375/341 |
| 6,631,172 B1 | 10/2003 | Shokrollahi et al. | |
| 6,925,479 B2 | 8/2005 | Chen et al. | |
| 7,268,706 B2 * | 9/2007 | Dally et al. | 341/58 |
| 7,278,088 B2 * | 10/2007 | Tsai et al. | 714/795 |
| 7,353,449 B2 | 4/2008 | Muller et al. | |
| 7,516,394 B2 * | 4/2009 | Ashley et al. | 714/784 |
| 2009/0222477 A1 * | 9/2009 | Kamra et al. | 707/102 |

FOREIGN PATENT DOCUMENTS

JP   6077844 A   3/1994

OTHER PUBLICATIONS

Kotter, R., "Fast parallel implementation of a Berlekamp-Massey algorithm for algebraic-geometric codes", IEEE Transactions on Information Theory, Jul. 1998, p. 1353-1368, vol. 44 No. 4.
Fickle, "Single byte CRC Generator", TDB Feb. 1988, 1988.
Reed et al., "Polynomial Codes Over Certain Finite Fields", Journal of the Society for Industrial and Applied Mathematics, Jun. 1960, pp. 300-304, vol. 8, issue 2.

\* cited by examiner

*Primary Examiner* — Esaw Abraham
(74) *Attorney, Agent, or Firm* — Kenneth L. Sherman, Esq.; Michael Zarrabian, Esq.; Sherman & Zarrabian LLP

(57) ABSTRACT

The invention provides a method, device and system for encoding and decoding data. The method includes receiving information including data units, storing the data units into a memory and encoding the data units by performing a plurality of store and exclusive-or operations on the data units resulting in encoded symbols $S_n$, where n is a positive integer.

16 Claims, 4 Drawing Sheets

ENCODING AND DECODING DATA USING STORE AND EXCLUSIVE OR OPERATIONS

This invention was made with United States Government support under Agreement No. HR0011-07-9-0002 awarded by DARPA. The Government has certain rights in the invention.

BACKGROUND OF THE INVENTION

1. Field of the Invention

The present invention relates generally to data authentication, and in particular, to storing data on an untrusted machine and preserving the trustworthiness efficiently by minimizing the resource usage on a trusted computing base.

2. Background Information

Reed-Solomon (RS) was introduced by Irving S. Reed and Gustave Solomon of MIT Labs in *Polynomial Codes Over Certain Finite Fields*, which was published in the Journal of the Society for Industrial and Applied Mathematics in 1960. RS code is a type of Bose-Chaudhuri-Hocquenghem (hereinafter, referred to as "BCH") code and is a linear block code. RS coding provides block error correction coding and is widely used in applications such as digital data communication and data storage. For example, RS coding has found application in such varied products as hard disk drives (HDD), CDs, DVDs, barcodes, wireless and mobile communication systems, satellite communication systems, and digital television.

The need for error correction coding arises from the inevitable data or signal noise or data errors which result whenever data is stored to a physical medium or transmitted over an imperfect communications channel. An RS encoder receives original data in a predetermined block format and adds redundant bits to the data to generate a codeword. An RS decoder receives the encoded data and related parity check data and recovers the original data when an error occurs because of transmission or storage.

RS coding of data has traditionally been performed in specially designed hardware. Attempts at software implementations have had poor performance. In the typical code, the way the hardware performs RS encoding is emulated. This means that the data is treated as bit serial and the processor manipulates the bit stream. Since it is difficult in hardware to work with less than a byte, it is usually assumed that the RS code will use Galois Field ($2^8$) (GF($2^8$)). Because this approach does not allow for efficient processor utilization, the approach is often augmented by using special processor instructions.

With Reed-Solomon encoding of disk data for double fault tolerant disk arrays (RAID 6), each data disk in the disk array is encoded with a different element of the Galois Field. For example, data from disk 0 will be encoded with $a^0$ and data disk n will be encoded with $a^n$. The encoded data from each disk is exclusive-or summed and placed on the parity disk. This parity is usually referred to as Q parity, while the P parity is the normal exclusive-or sum of the data disk as done for RAID 5. The combination of the 2 parities, P and Q, allows data to be recovered if any two data disks in the array should fail.

RS encoding is usually done 8 bits at a time. If D is input 8 bits of data, S is the 8 bit encoded output and V[n] represents the eight 8-bit encoding element, then the formula is illustrated as:

Bit-n of S=sum(V[n]×D), where sum=exclusive-or and multiply symbol=and. For a1, a workable V looks like:

V[0]=0 0 0 0 0 0 0 1
V[1]=1 0 0 0 0 0 0 0
V[2]=0 1 0 0 0 0 0 1
V[3]=0 0 1 0 0 0 0 1
V[4]=0 0 0 1 0 0 0 1
V[5]=0 0 0 0 1 0 0 0
V[6]=0 0 0 0 0 1 0 0
V[7]=0 0 0 0 0 0 1 0

Using the above equation results with:
Bit 0 of S=bit 7 of D
Bit 1 of S=bit 0 of D
Bit 2 of S=bit 1 of D exclusive-or bit 7 of D
Bit 3 of S=bit 2 of D exclusive-or bit 7 of D
Bit 4 of S=bit 3 of D exclusive-or bit 7 of D
Bit 5 of S=bit 4 of D
Bit 6 of S=bit 5 of D
Bit 7 of S=bit 6 of D Hardware encoding can be realized in a large number of ways and is usually application unique. The main trade-off is the number of gates versus performance. Software encoding (and decoding) has been implemented in way that is faithful to hardware encoding. The encoding is done on successive 8 bit quantities from the input data stream. However, a large number of instructions are required to perform the necessary bit manipulation. Instead, a 256 entry table is made and every byte of data is used as an index into the table and the returned byte is the encoded value. A pseudo-code representation is illustrated as:

```
Read 64 bit word
Index = result of masking off upper 7 bytes
S = table(index)
Store S
For next 7 bytes:
    Index = shift word right 8 bits
    Index = result of masking off upper 7 bytes
    Next S = table(index)
    Store S.
```

As such, for every word (8 bytes) encoded, the processor executes 32 instructions, which takes a lot more time than a HW implemented RS encoding.

SUMMARY OF THE INVENTION

The invention provides a method, device and system for encoding and decoding data. The method includes receiving information including data units, storing the data units into a memory and encoding the data units by performing a plurality of store and exclusive-or operations on the data units resulting in encoded symbols $S_n$, where n is a positive integer.

One embodiment of the invention involves an encoder. The encoder includes an input module configured to receive information including a plurality of data units, a processing module configured to store the data units in a memory, and an encoding module configured to encode the plurality of data units by processing a plurality of store and exclusive-or operations on the data units resulting in encoded symbols $S_n$, where n is a positive integer.

Another embodiment of the invention involves a computer program product for encoding data that causes a computer to receive information including data units, store the data units into a memory and encode the data units by processing a plurality of store and exclusive-or operations on the data units resulting in encoded symbols $S_n$, where n is a positive integer.

A further embodiment of the invention involves a decoder. The decoder including an input module configured to receive information including a plurality of encoded data units, a processing module configured to store the encoded data units in a memory, and a decoding module configured to decode the plurality of data by processing a plurality of store and exclusive-or operations on the encoded data units resulting in decoded symbols $S_n$, where n is a positive integer.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the invention, as well as a preferred mode of use, reference should be made to the following detailed description read in conjunction with the accompanying drawings, in which.

DESCRIPTION OF THE PREFERRED EMBODIMENTS

The following description is made for the purpose of illustrating the general principles of the invention and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

The description may disclose several preferred embodiments for encoding/decoding data, as well as operation and/or component parts thereof. While the following description will be described in terms of authentication of data and devices for clarity and to place the invention in context, it should be kept in mind that the teachings herein may have broad application to all types of systems, devices and applications.

The invention provides a method, device and system for encoding and decoding data. The method includes receiving information including data units, storing the data units into a memory and encoding the data units by performing a plurality of store and exclusive-or operations on the data units resulting in encoded symbols $S_n$, where n is a positive integer.

Figure 1:
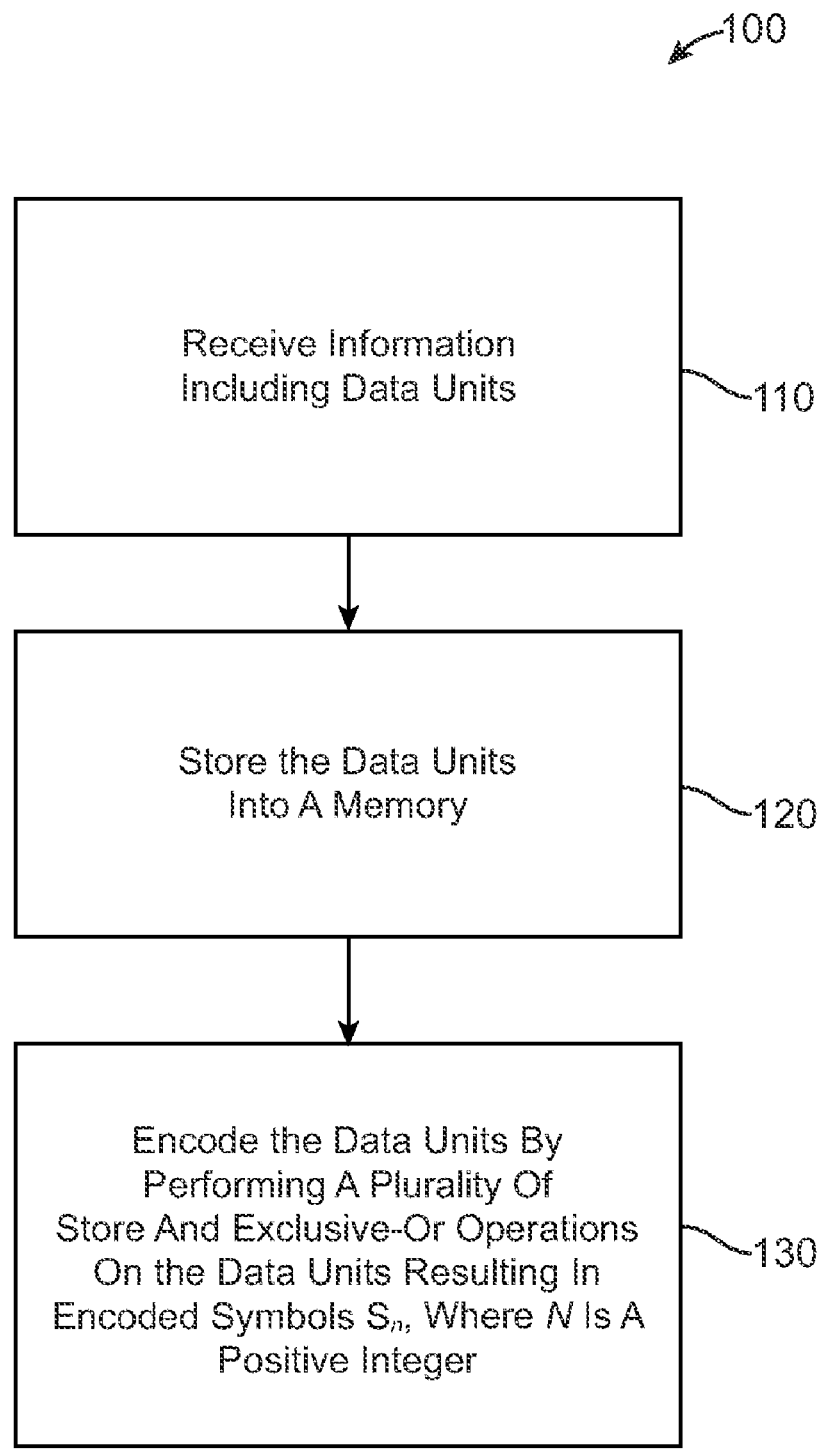
FIG. 1 illustrates a block diagram of a process for encoding data according to an embodiment of the invention.

FIG. 1 illustrates a block diagram of a process 100 for encoding. In block 110, information including data are received from a source, such as a processing device, data system, etc. In block 120 the received data are stored into a memory. In one embodiment of the invention the stored data are read sequentially from the memory into registers, such as general purpose registers. In one embodiment of the invention, the data units are interleaved over k words (where a word may be 8, 16, 32, 64 or 128 bits long. In the discussion below a word is taken as equal to 64 bits.), where k is a positive integer (e.g., k=4, 8, 16, 32, 64, etc., whether binary or not). For ease of discussion, the encoding method is described as an example using k=8 words. In this example of one embodiment of the invention, the data are read in sequentially. In one embodiment of the invention the k words are read from the memory into the registers using load instructions (e.g., 8 load instructions for k=8)

In block 130 the data units are encoded by performing store and exclusive-or operations on the data units resulting in encoded symbols $S_n$, where n is a positive integer. In one embodiment of the invention block 130 generates n encoded symbols $S_n$, where n is an integer from 0-63 and stores $S_n$ in the memory.

In the example of k=8 (0-7), in one embodiment of the invention, 8 bits that are spread across 8 words (64 bytes) are encoded. The bits to be encoded are referred as data units n, where n ranges from 0-63. In this embodiment of the invention the k words are read sequentially from memory into the registers and the data units are defined as follows:

bit 0 of data unit 0=bit 0 of word 0
bit 1 of data unit 0=bit 0 of word 1
bit k of data unit 0=bit 0 of word k
bit 0 of data unit 1=bit 1 of word 0
bit k of data unit n=bit n of word k Since there are 64 data units in this example encoding produces 64 encoded symbols which are referred to as $S_n$ where n is a positive integer ranging from 0 to 63 and is the result of encoding data units n. In one embodiment of the invention, applying the above encoding equations to data units n generates the following and defining $D_n$=data unit n:

bit 0 of $S_0$=bit 7 of D0=bit 0 of word 7
bit 0 of $S_1$=bit 7 of D1=bit 1 of word 7
bit 0 of $S_n$=bit 7 of $D_n$=bit n of word 7
bit 1 of $S_n$=bit 0 of $D_n$=bit n of word 0
bit 2 of $S_n$=bit 1 of $D_n$ exclusive-or bit 7 of $D_n$=bit n of word 1 exclusive-or bit n of word 7.

From the above, one can see:

All of the bits 0 of the 64 encoded symbols are equal to word 7.

All of the bits 1 of the 64 encoded symbols are equal to word 0.

All of the bits 2 of the 64 encoded symbols are equal to word 1 exclusive-or word 7.

All of the bits 3 of the 64 encoded symbols are equal to word 2 exclusive-or word 7.

All of the bits 4 of the 64 encoded symbols are equal to word 3 exclusive-or word 7.

All of the bits 5 of the 64 encoded symbols are equal to word 4.

All of the bits 6 of the 64 encoded symbols are equal to word 5.

All of the bits 7 of the 64 encoded symbols are equal to word 6.

It is convenient then to treat the data unit (data symbol) as made up of k words instead of k bits and the collection of the 64 symbols, $S_0$ to $S_{63}$, as S.

In this example, in one embodiment of the invention, block 130 encodes the data units n as follows:

store word 7 as element 0 of S;
store word 0 as element 1 of S;
generate a result of word 1 exclusive-or word 7, and store the result as element 2 of S;
generate a result of word 2 exclusive-or word 7 and store the result as element 3 of S;
generate a result of word 3 exclusive-or word 7 and store the result as element 4 of S;
store word 4 as each element 5 of S;
store word 5 as each element 6 of S; and
store word 6 as each element 7 of S.

As described so far, instead of encoding the first k bits of a sequential data stream, the process is improved by speeding up the processing since the k bits are spread over k words. Assuming the word size is 64 bits, then 64 data symbols (data units) are encoded in parallel. The encoded symbols that result are also spread over the k words. Furthermore, if data symbols are interleaved as described, the encoding is as though each element of a data symbol is a word and k sequential words make up this symbol. In the disk array example discussed below, the collection of (64) $S_n$ is represented as S and the collection of (64) $D_n$ is represented as D. S and D consist of k words each. All of the data on disk n is encoded with an RS element $a^n$. Therefore, S[disk n]=$a^n$D[disk n]. The resulting equations are as follows:

$$P=D[0]+D[1]+\ldots+D[n]$$

$$Q=S[0]+S[1]+\ldots+S[n] \text{ and } n<2^k-1.$$

With this, if any two data symbols D are lost, they can be recovered later by using the following equation:

$$D[i]=(a^jP'+Q')\div(a^i+a^j)$$

where I and j are interchanged to find any data symbol D[j].

Where P' and Q' are the reduced parities, i.e. the known data is xor'd with P and encoded known data is xor'ed with Q to produce:

$$P'=D[i]+D[j]$$

$$S'=S[i]+S[j]$$

In one embodiment of the invention, instead of requiring a device, such as a processor, to do bit manipulation, normal instructions are performed, including: read data into registers, exclusive-or contents of two registers, and store the contents of registers. In the example discussed where k=8, process 100 encodes 64 bytes of data. Additionally, the mapping used makes the symbol $S_n$ look like it is made up of 8 words instead of 8 bits and the bit equations turn into word equations.

In one embodiment of the invention, for the example where k=8, the total instructions/steps to encode 64 bytes of data is 19, or 0.3 instructions per encoded byte. This is significantly better than the conventional approach of about 4 instructions per byte.

Figure 2:
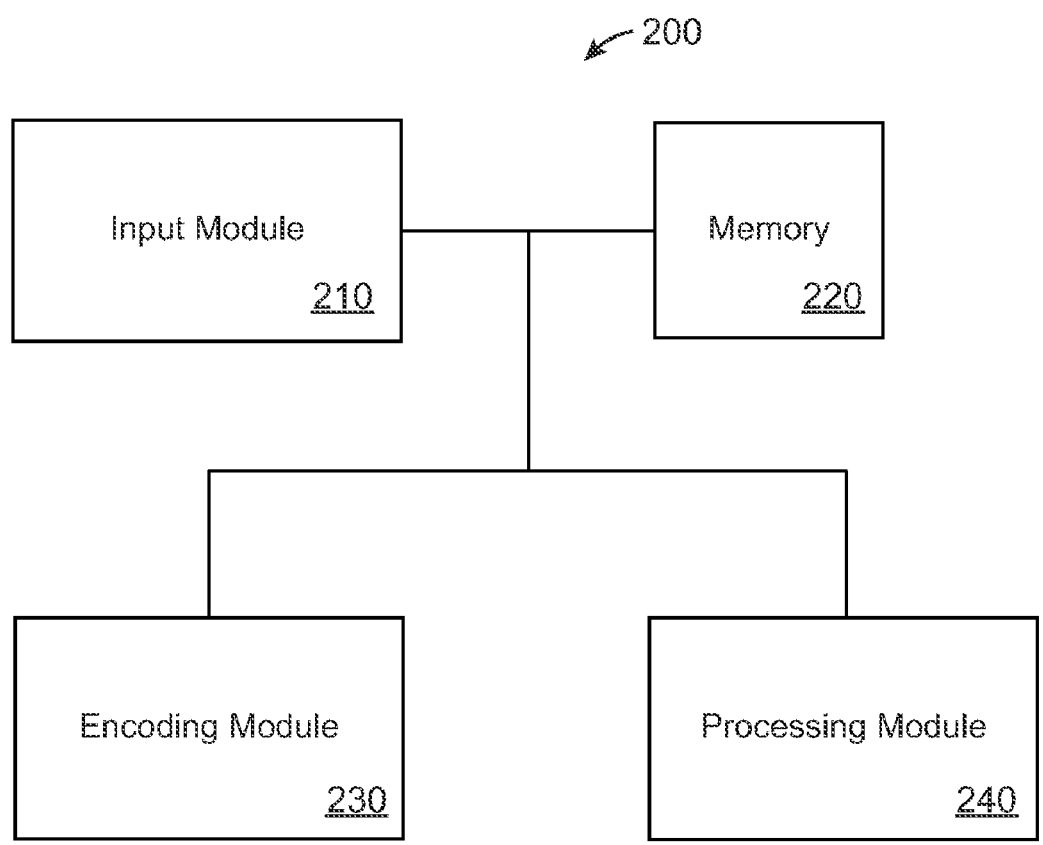
FIG. 2 illustrates an encoder according to an embodiment of the invention.

FIG. 2 illustrates an encoder 200 according to an embodiment of the invention. In one embodiment of the invention the encoder 200 includes an input module 210, a memory 220, an encoding module 230 and a processing module 240. In one embodiment of the invention, encoder 200 performs the processes described for process 100. In this embodiment of the invention, the input module 210 receives data units for encoding and stores the data units in the memory 220. The encoding module 230 retrieves the data units from the memory 220 and encodes the data units according to the process 100. The processing module 240 controls the storing of data from the encoding module 230 and also the communications of receiving the data units and transmitting data units.

Figure 3:
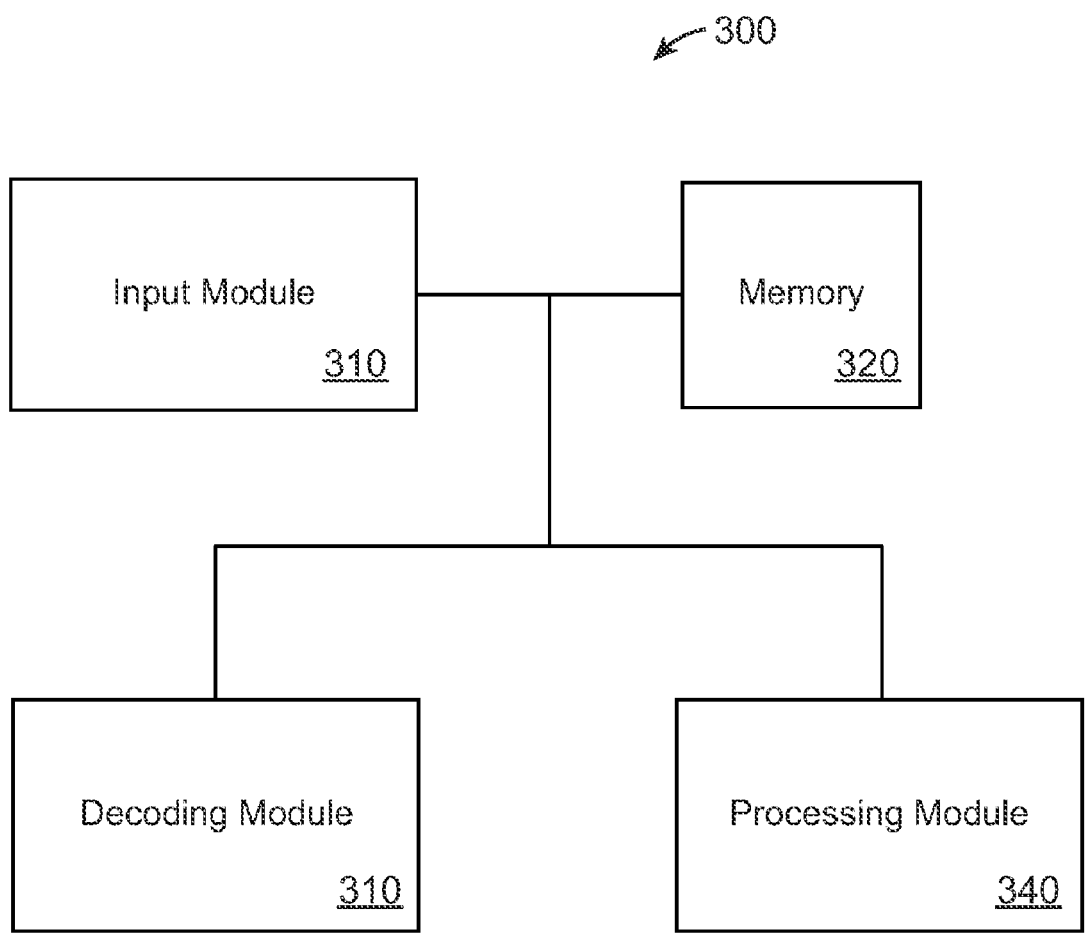
FIG. 3 illustrates a decoder according to an embodiment of the invention.

FIG. 3 illustrates a decoder 300 according to an embodiment of the invention. In one embodiment of the invention the decoder 300 includes an input module 310, a memory 320, a decoding module 330 and a processing module 340. In one embodiment of the invention, decoder 300 performs the reverse process described for process 100 to decode encoded data units. In this embodiment of the invention, the input module 310 receives encoded data units for decoding and stores the data units in the memory 320. The decoding module 330 retrieves the data units from the memory 320 and decodes the data units according to the reverse of process 100. The processing module 340 controls the storing of data from the decoding module 330 and also the communications of receiving the data units and transmitting data units.

Figure 4:
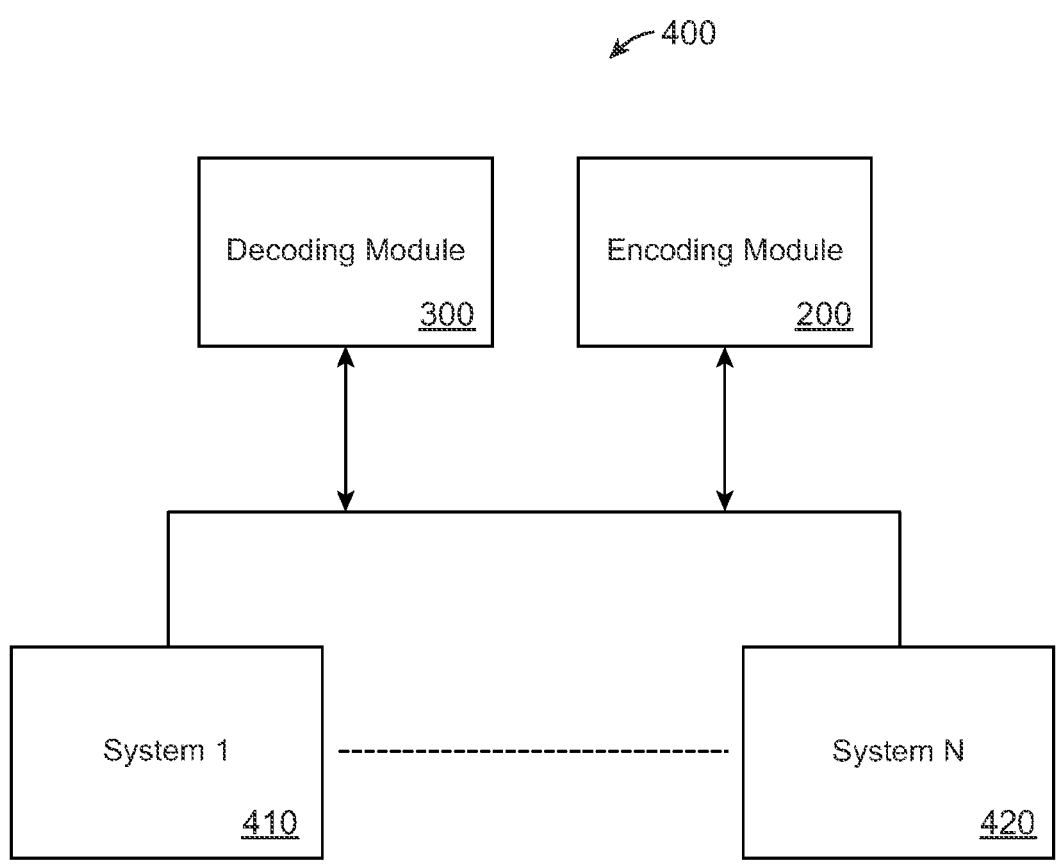
FIG. 4 illustrates a distributed trusted system according to an embodiment of the invention.

FIG. 4 illustrates a distributed system 400 according to one embodiment of the invention. In one embodiment of the invention, the system 400 is a distributed network, including a plurality of systems 1 410 to N 420, the encoder 200 and the decoder 300. In this embodiment of the invention the systems 1 410 to system N 420 each use the encoder 200 and decoder 300.

The embodiments of the invention have advantages over prior art encoders/decoders by having all of the information for creating the parity symbols resident in a processing device's registers or cache. Therefore the parity symbols are processed at the same time and data is only read from memory once. The various embodiments of the invention can be used for decoding/encoding disk arrays, CDs, DVDs, barcodes, wireless and mobile communication systems, satellite communication systems, and digital television, etc.

The embodiments of the invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer, processing device, or any instruction execution system. For the purposes of this description, a computer-usable or computer readable medium can be any apparatus that can contain, store, communicate, or transport the program for use by or in connection with the instruction execution system, apparatus, or device.

The medium can be electronic, magnetic, optical, or a semiconductor system (or apparatus or device). Examples of a computer-readable medium include, but are not limited to, a semiconductor or solid state memory, magnetic tape, a removable computer diskette, a RAM, a read-only memory (ROM), a rigid magnetic disk, an optical disk, etc. Current examples of optical disks include compact disk-read only memory (CD-ROM), compact disk-read/write (CD-R/W) and DVD.

I/O devices (including but not limited to keyboards, displays, pointing devices, etc.) can be connected to the system either directly or through intervening controllers. Network adapters may also be connected to the system to enable the data processing system to become connected to other data processing systems or remote printers or storage devices through intervening private or public networks. Modems, cable modem and Ethernet cards are just a few of the currently available types of network adapters.

In the description above, numerous specific details are set forth. However, it is understood that embodiments of the invention may be practiced without these specific details. For example, well-known equivalent components and elements may be substituted in place of those described herein, and similarly, well-known equivalent techniques may be substituted in place of the particular techniques disclosed. In other instances, well-known structures and techniques have not been shown in detail to avoid obscuring the understanding of this description.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

While certain exemplary embodiments have been described and shown in the accompanying drawings, it is to be understood that such embodiments are merely illustrative of, and not restrictive on, the broad invention, and that this invention not be limited to the specific constructions and arrangements shown and described, since various other modifications may occur to those ordinarily skilled in the art.

What is claimed is:

1. A method for encoding data, the method comprising:
   receiving information including data units;
   storing the data units into a memory;
   reading the data units sequentially from the memory into a plurality of registers; and
   employing a hardware processor for encoding the data units in the plurality of registers by performing a plurality of store and exclusive-or operations on the data units resulting in encoded symbols $S_n$, where n is a positive integer, wherein the data units are interleaved over k 64-bit words, where k is a positive integer.

2. The method of claim 1, wherein the exclusive-or operations are performed on contents of two of the plurality of registers.

3. The method of claim 2, further comprising:
   generating n encoded symbols $S_n$ from the encoding, where n is an integer from 0-63; and
   storing $S_n$ in the memory as follows:
      storing each bit 0 of the 64 encoded data symbols equal to word 7;
      storing each bit 1 of the 64 encoded data symbols equal to word 0;
      storing each bit 2 of the 64 encoded data symbols equal to word 1 exclusive-or word 7;
      storing each bit 3 of the 64 encoded data symbols equal to word 2 exclusive-or word 7;
      storing each bit 4 of the 64 encoded data symbols equal to word 3 exclusive-or word 7;
      storing each bit 5 of the 64 encoded data symbols equal to word 4;
      storing each bit 6 of the 64 encoded data symbols equal to word 5; and
      storing each bit 7 of the 64 encoded data symbols equal to word 6.

4. The method of claim 2, further comprising:
   generating n encoded symbols $S_n$ from the encoding, where n is an integer from 0-63, as follows:
      storing word 7 as elements 0 of $S_0$-$S_{63}$;
      storing word 0 as element 1 of $S_0$-$S_{63}$;
      generating a result of word 1 exclusive-or word 7, and storing the result as element 2 of $S_0$-$S_{63}$;
      generating a result of word 2 exclusive-or word 7 and storing the result as element 3 of $S_0$-$S_{63}$;
      generating a result of word 3 exclusive-or word 7 and storing the result as element 4 of $S_0$-$S_{63}$;
      storing word 4 as each element 5 of $S_0$-$S_{63}$;
      storing word 5 as each element 6 of $S_0$-$S_{63}$; and
      storing word 6 as each element 7 of $S_0$-$S_{63}$.

5. The method of claim 4, wherein each element is equivalent to a word and a symbol is made up of k consecutive words.

6. The method of claim 4, wherein the encoding is performed on one of a disk array and a memory device.

7. An encoder comprising:
   an input module that receives information including a plurality of data units;
   a processing module employing a hardware processor for storing the data units in a memory, and for reading the data units sequentially from the memory into a plurality of registers; and
   an encoding module that encodes the plurality of data units in the plurality of registers by processing a plurality of store and exclusive-or operations on the data units resulting in encoded symbols $S_n$, where n is a positive integer, wherein the data units are interleaved over k words each having 64 bits, where k is a positive integer.

8. The encoder of claim 7, wherein the exclusive-or operations are performed on contents of two of the plurality of registers.

9. The encoder of claim 8, wherein encoding module generates n encoded symbols $S_n$, where n is an integer from 0-63; and
   stores Sn in the memory as follows:
      store each bit 0 of the 64 encoded symbols equal to word 7;
      store each bit 1 of the 64 encoded symbols equal to word 0;
      store each bit 2 of the 64 encoded symbols equal to word 1 exclusive-or word 7;
      store each bit 3 of the 64 encoded symbols equal to word 2 exclusive-or word 7;
      store each bit 4 of the 64 encoded symbols equal to word 3 exclusive-or word 7;
      store each bit 5 of the 64 encoded symbols equal to word 4;
      store each bit 6 of the 64 encoded symbols equal to word 5; and
      store each bit 7 of the 64 encoded symbols equal to word 6.

10. The encoder of claim 8, wherein the encoding module further generates an encoded symbol S, where the elements of the symbol are equated to whole words instead of bits:
    store word 7 as element 0 of S;
    store word 0 as element 1 of S;
    generate a result of word 1 exclusive-or word 7, and storing the result as element 2 of S;
    generate a result of word 2 exclusive-or word 7 and storing the result as element 3 of S;
    generate a result of word 3 exclusive-or word 7 and storing the result as element 4 of S;
    store word 4 as each element 5 of S;
    store word 5 as each element 6 of S; and
    store word 6 as each element 7 of S.

11. The encoder of claim 10, wherein each element of the data symbol to be encoded is equivalent to a word.

12. The encoder of claim 7, wherein the encoding is performed on one of a disk array and a memory device.

13. A computer program product for encoding data embodied on a non-transitory computer usable medium including a computer readable program, wherein the computer readable program when executed on a computer causes the computer to:

receive information including data units;

store the data units into a memory;

read the data units sequentially from the memory into a plurality of registers; and encode the data units in the plurality of registers by processing a plurality of store and exclusive-or operations on the data units resulting in encoded symbols $S_n$, where n is a positive integer, wherein the data units are interleaved over k words each having 64 bits, where k is a positive integer.

14. The computer program product of claim 13, wherein the exclusive-or operations are performed on contents of two of the plurality of registers.

15. The computer program product of claim 14, further causing the computer to:

generate n encoded symbols $S_n$ from the encoding, where n is an integer from 0-63, as follows:

store word 7 as elements 0 of $S_0$-$S_{63}$;

store word 0 as elements 1 of $S_0$-$S_{63}$;

generate a result of word 1 exclusive-or word 7, and storing the result as elements 2 of $S_0$-$S_{63}$;

generate a result of word 2 exclusive-or word 7 and storing the result as elements 3 of $S_0$-$S_{63}$ generate a result of word 3 exclusive-or word 7 and storing the result as elements 4 of $S_0$-$S_{63}$;

store word 4 as each elements 5 of $S_0$ -$S_{63}$;

store word 5 as each elements 6 of $S_0$ -$S_{63}$; and store word 6 as each elements 7 of $S_0$ -$S_{63}$.

16. A decoder comprising:

an input module that receives information including a plurality of encoded data units;

a processing module employing a hardware processor that stores the encoded data units in a memory, and that reads the data units sequentially from the memory into a plurality of registers; and a decoding module that decodes the plurality of data in the plurality of registers by processing a plurality of store and exclusive-or operations on the encoded data units resulting in decoded symbols $S_n$, where n is a positive integer, wherein decoding module generates n decoded symbols $S_n$, where n is an integer from 0-63; and stores Sn in the memory as follows:

store each bit 0 of the 64encoded symbols equal to word 7;

store each bit 1 of the 64encoded symbols equal to word 0;

store each bit 2 of the 64encoded symbols equal to word 1 exclusive-or word 7;

store each bit 3 of the 64encoded symbols equal to word 2 exclusive-or word 7;

store each bit 4 of the 64encoded symbols equal to word 3 exclusive-or word 7;

store each bit 5 of the 64encoded symbols equal to word 4;

store each bit 6 of the 64encoded symbols equal to word 5; and store each bit 7 of the 64encoded symbols equal to word 6, where k is a positive integer.

* * * * *